United States Patent
Iwai

(10) Patent No.: US 11,815,540 B2
(45) Date of Patent: Nov. 14, 2023

(54) SYSTEM AND METHOD FOR NOISE MEASUREMENT

(71) Applicant: Keysight Technologies, Inc., Santa Rosa, CA (US)

(72) Inventor: Junichi Iwai, Kobe (JP)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 17/365,103

(22) Filed: Jul. 1, 2021

(65) Prior Publication Data

US 2023/0003782 A1    Jan. 5, 2023

(51) Int. Cl.
*G01R 29/26* (2006.01)
*H03F 3/19* (2006.01)

(52) U.S. Cl.
CPC ............. *G01R 29/26* (2013.01); *H03F 3/19* (2013.01)

(58) Field of Classification Search
CPC .................................. G01R 29/26; H03F 3/19
See application file for complete search history.

(56) References Cited

U.S. PATENT DOCUMENTS

| | | | |
|---|---|---|---|
| 9,442,148 B2 * | 9/2016 | Chow ..................... | G01R 29/26 |
| 9,473,158 B1 * | 10/2016 | Delos ..................... | H04B 1/06 |
| 10,120,008 B2 | 11/2018 | Cutler | |
| 2007/0225927 A1 * | 9/2007 | Bessho .................. | G01R 29/26 |
| | | | 702/72 |
| 2016/0028498 A1 * | 1/2016 | Verspecht ............ | H03D 7/1441 |
| | | | 455/226.1 |
| 2016/0033563 A1 * | 2/2016 | Needham ........... | G01R 31/2841 |
| | | | 324/76.23 |

FOREIGN PATENT DOCUMENTS

DE    102011011978 B4    4/2017

OTHER PUBLICATIONS

Mark S. Oude Alink et al., "Improving Harmonic Rejection for Spectrum Sensing using Crosscorrelation", 2012 Proceedings of the ESSCIRC (ESSCIRC), Sep. 17-21, 2012, pp. 361-364.
Mark S. Oude Alink, "RF Spectrum Sensing in CMOS Exploiting Crosscorrelation", Centre for Telematics and Information Technology, 2013, pp. 1-181.
English translation of DE102011011978B4, 9 pgs.

* cited by examiner

*Primary Examiner* — Alesa Allgood
*Assistant Examiner* — Sangkyung Lee

(57) ABSTRACT

A receiver is for measuring the output noise of a device-under-test (DUT). The receiver includes an input port configured to connect to an output of the DUT, first and second measurement channels, and a cross-correlation circuit. The first measurement channel includes a first amplifier, a first mixer, a first local oscillator (LO), and a first analog-to-digital converter (ADC). The second measurement channel includes a second amplifier, a second mixer, a second local oscillator (LO), and a second analog-to-digital converter (ADC). A second LO frequency is different than a first LO frequency. The cross-correlation circuit is configured to cross-correlate sample values obtained from the first and second measurement channels to obtain the output noise of the DUT.

20 Claims, 6 Drawing Sheets

SYSTEM AND METHOD FOR NOISE MEASUREMENT

BACKGROUND

Noise figure and noise factor are key parameters used to characterize the ability of receivers and their lower-level components to process weak signals in the presence of thermal noise. For example, when measuring low-noise amplifiers (LNAs), these parameters describe the signal-to-noise degradation that occurs due to the internally-generated noise of the active devices within an LNA.

The "noise factor" (F) of a device, such as an amplifier or radio receiver, denotes the ratio between the input signal-to-noise ratio (SNR) of the device to the output signal-to-noise ratio of the device. On the other hand, the "noise figure" (NF) of the device is the noise factor expressed in decibels. More precisely, the noise figure is the difference in decibels (dB) between the output noise of the actual device and the output noise of an ideal device at the same gain and bandwidth under a condition in which the actual and ideal devices are connected to matched terminations at a given standard temperature (referred to as a "noise temperature").

FIG. 1 is a circuit diagram of a noise receiver 30 for measuring the output noise (or noise power) of a device-under-test (DUT) 20. The noise receiver may be used in conjunction with separate circuitry (not shown) that measures a gain of the DUT 20. The DUT 20 is assumed for explanation purposes to be an amplifier. As shown, an input of the DUT 20 is coupled to a termination (T) 10 which constitutes a controlled noise source. An output of the DUT 20 is coupled to an input port 31 of a noise receiver 30. Typically, the connection between the DUT 20 and input port 31 is by coaxial cable.

The measurement receiver 30 includes an amplifier, a pre-selector 33, a frequency mixer 34, a local oscillator (LO) 35 and an analog-to-digital converter (ADC) 36. In operation, the amplifier 32 of the receiver amplifies an output noise of the DUT 20. The output of the amplifier 32 is bandpass filtered by the pre-selector 33, and an output of the pre-selector 33 is frequency reduced to baseband by the mixer 34 driven by the LO 35. The resultant baseband signal is converted to a digital signal by the ADC 36. Although not shown, the digital output of the ADC 36 may be applied to one or more of a spectrum analyzer, oscilloscope, personal computer (PC) and the like.

The conventional noise measurement receiver 30 necessarily measures the combined noise power of the DUT 20 and the receiver 30. As explained below, even if the receiver 30 is noise calibrated, the measurement sensitivity is limited by the magnitude of the receiver noise relative to the magnitude of the DUT noise.

The noise factor $F_{DUT}$ and noise figure $NF_{DUT}$ of the DUT 30 may be determined from Equation 1 below using known values k, $T_0$ and B and measured values Y, N and $G_{DUT}$.

$$F_{DUT} = \frac{X}{kT_0 BG_{DUT}} = \frac{Y-N}{kT_0 BG_{DUT}}, \quad \text{Equation 1}$$

$$NF_{DUT} = 20\log(F_{DUT})$$

where GDUT is the gain of the DUT,
k is Boltzmann's constant,
B is the measurement bandwidth
T0 is the noise temperature
Y is the measured (total) noise N is the receiver noise
X is the DUT output noise (Y−N)

The DUT output noise X is needed to determine the DUT noise figure (or noise factor). However, in the case where receiver noise N is large relative to DUT output noise X (i.e., N>>X), the accuracy of noise figure measurement is degraded. As such, to improve sensitivity, a typical approach is to apply a low noise amplifier (LNA) at the first stage of the receiver. Even so, however, an LNA may not be sufficient in the case where the DUT has low output noise or low gain.

Separately, unwanted frequency conversion responses may occur at the output of the mixer 34. These include image responses ($f_{LO}+f_{IF}$, or $f_{LO}-f_{IF}$ (where $f_{LO}$ is the local oscillator frequency and $f_{IF}$ is an intermediate frequency at the input of the mixer 34)), harmonic responses ($2fLO\pm f_{IF}$, $3fLO\pm f_{IF}$, and so on), and spurious responses. For this reason, the pre-selector 33 is provided to pass a preselected band of frequencies to the input of the mixer 34. However, in order to cover a wide frequency range, a relatively large and complex filtering system is needed.

SUMMARY

According to an aspect of the inventive concepts, a receiver for measuring the output noise of a device-under-test (DUT) is provided. The receiver includes an input port configured to connect to an output of the DUT, a first measurement channel, a second measurement channel, and a cross-correlation circuit. The first measurement channel includes a first amplifier having an input connected to the input port, a first mixer having an input connected to an output of the first amplifier, a first local oscillator (LO) for driving the first mixer at a first LO frequency, and a first analog-to-digital converter (ADC) for converting an output of the first mixer to a first total noise digital signal. The second measurement channel includes a second amplifier having an input connected to the input port, a second mixer having an input connected to an output of the first amplifier, a second local oscillator (LO) for driving the second mixer at a second LO frequency which is different than the first LO frequency, and a second analog-to-digital converter (ADC) for converting an output of the second mixer to a second total noise digital signal. The cross-correlation circuit configured to cross-correlate sample values obtained from the first and second total noise digital signals of the respective first and second measurement channels to obtain the output noise of the DUT.

The first measurement channel may be devoid of a pre-selector between the input port and the input of the first mixer, and the second measurement channel is devoid of a pre-selector between the input port and the input of the second mixer.

The cross-correlation circuit may be configured to cross-correlate the sample values according to the following equation:

$$<Y1Y2^*>_m = <|X|^2>_m$$

where: X is the output noise of the DUT,
Y1 is a total output noise of the first channel,
Y2 is a total output noise of the second channel,
m is a number of sample values obtained for each of the first and second channels,
* indicates a complex conjugate, and
$< >_m$ denotes an average of m sample values.

The number m may be an integer of at least 1. The number m may be set in advance by a user, and cross-correlation of the sample values may be complete to obtain a final value of X when the number of samples reaches m. Alternatively, cross-correlation of the sample values may terminate to obtain a final value of X when the when an increased resolution in X from one sample value to a next sample value reaches a preset value.

The frequency of the output noise may be in the RF spectrum.

According to another aspect of the inventive concepts, a measurement system for measuring a noise parameter of a device-under-test (DUT) is provide, where the noise parameter is at least one of a noise factor and a noise figure of the DUT. The system includes a reference circuit configured for connection to an input of the DUT, and a noise-measurement receiver configured to measure an output noise of the DUT while the reference circuit is connected to the input of the DUT. The noise-measurement receiver includes an input port configured to connect to an output of the DUT, a first measurement channel, a second measurement channel, and a cross-correlation circuit. The first measurement channel includes a first amplifier having an input connected to the input port, a first mixer having an input connected to an output of the first amplifier, a first local oscillator (LO) for driving the first mixer at a first LO frequency, and a first analog-to-digital converter (ADC) for converting an output of the first mixer to a first total noise digital signal. The second measurement channel includes a second amplifier having an input connected to the input port, a second mixer having an input connected to an output of the first amplifier, a second local oscillator (LO) for driving the second mixer at a second LO frequency which is different than the first LO frequency, and a second analog-to-digital converter (ADC) for converting an output of the second mixer to a second total noise digital signal. The cross-correlation circuit configured to cross-correlate sample values obtained from the first and second total noise digital signals of the respective first and second measurement channels to obtain the output noise of the DUT.

The reference circuit may be one of a resistive termination or a tunable impedance source.

The noise-measurement receiver may be further configured to compute the noise parameter of the DUT for the obtained output noise of the DUT.

The measurement system may further include an external device configured to compute the noise parameter of the DUT for the obtained output noise of the DUT.

The first measurement channel may be devoid of a pre-selector between the input port and the input of the first mixer, and the second measurement channel may be devoid of a pre-selector between the input port and the input of the second mixer.

The cross-correlation circuit may be configured to cross-correlate the sample values according to the following equation:

$$\langle Y1\,Y2^* \rangle_m = \langle |X|^2 \rangle_m$$

where: X is the output noise of the DUT,
Y1 is a total output noise of the first channel,
Y2 is a total output noise of the second channel,
m is a number of sample values obtained for each of the first and second channels,
* indicates a complex conjugate, and
$\langle\ \rangle_m$ denotes an average of m sample values.
The number m may be an integer of at least 1.

The number m may be set in advance by a user, and cross-correlation of the sample values may be complete to obtain a final value of X when the number of samples reaches m.

The cross-correlation of the sample values may terminate to obtain a final value of X when the when an increased resolution in X from one sample value to a next sample value reaches a preset value.

A frequency of the output noise may be in the RF spectrum.

According to another aspect of the inventive concepts, a method for measuring a noise parameter of a device-under-test (DUT) is provided, where the noise parameter is at least one of a noise factor and a noise figure of the DUT. The method includes connecting an input of the DUT to a reference circuit, and connecting an output of the DUT to a noise-measurement receiver. The method further includes using the noise-measurement receiver to measure an output noise of the DUT, and determining the noise parameter of the DUT from the output noise measured by the noise-measurement receiver. The noise-measurement receiver includes an input port configured to connect to an output of the DUT, a first measurement channel, a second measurement channel, and a cross-correlation circuit. The first measurement channel includes a first amplifier having an input connected to the input port, a first mixer having an input connected to an output of the first amplifier, a first local oscillator (LO) for driving the first mixer at a first LO frequency, and a first analog-to-digital converter (ADC) for converting an output of the first mixer to a first total noise digital signal. The second measurement channel includes a second amplifier having an input connected to the input port, a second mixer having an input connected to an output of the first amplifier, a second local oscillator (LO) for driving the second mixer at a second LO frequency which is different than the first LO frequency, and a second analog-to-digital converter (ADC) for converting an output of the second mixer to a second total noise digital signal. The cross-correlation circuit configured to cross-correlate sample values obtained from the first and second total noise digital signals of the respective first and second measurement channels to obtain the output noise of the DUT.

The reference circuit may be one of a resistive termination and a tunable impedance source.

The noise parameter determined by the noise-measurement receiver.

The noise parameter may be determined by an external device which receives the measured output noise of the DUT from the noise-measurement receiver.

The first measurement channel may be devoid of a pre-selector between the input port and the input of the first mixer, and the second measurement channel may be devoid of a pre-selector between the input port and the input of the second mixer.

BRIEF DESCRIPTION OF THE DRAWINGS

The above and other aspects of the inventive concepts will become readily apparent from the detailed description that follows, with reference to the accompanying drawings, in which.

DETAILED DESCRIPTION

Figure 1:
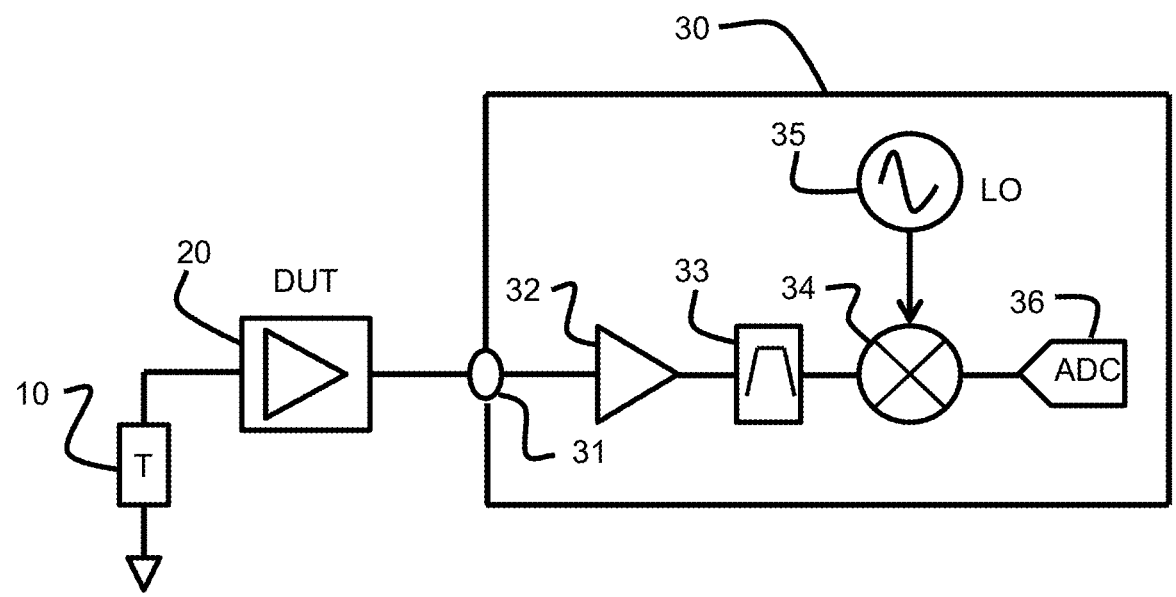
FIG. 1 is a circuit diagram for reference in describing a noise receiver according to the related art.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Figure 2:
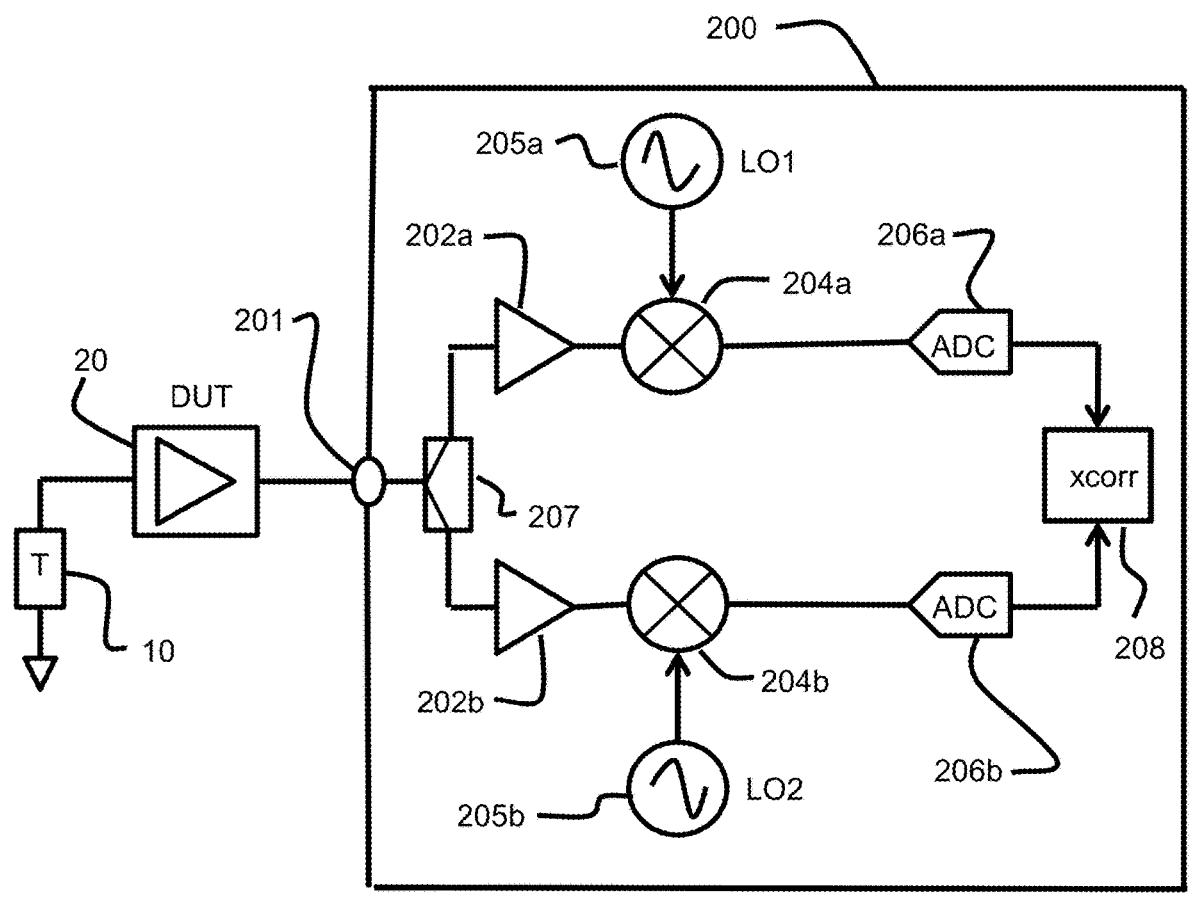
FIG. 2 is a circuit diagram for reference in describing a noise receiver according to an embodiment of the inventive concepts.

FIG. 2 is a circuit diagram for reference in describing a receiver 100 for use in measuring the noise figure and/or noise factor of a device-under-test (DUT) 20 according to an embodiment of the inventive concepts.

The DUT 20 is assumed for explanation purposes to be an amplifier. It will be understood, however, that an amplifier as the DUT 20 is merely an example. As shown, an input of the DUT 20 may be coupled to a termination (T) 10 which constitutes a controlled noise source.

As will be explained below, the noise measurement receiver 200 of the embodiment includes two independent receiver channels, and applies cross-correlation to the channel outputs. Sensitivity of the receiver 200 may not be limited by the noise floor of each receiver, and separately, sensitivity is enhanced with an increase in measurement time. The receiver 100 may be especially effective for DUTs having low output noise (i.e., DUTs having a low noise factor and/or a low gain).

Referring to FIG. 2, the receiver 200 includes an input port 201, a splitter 207, first and second amplifiers 202a and 202b, first and second mixers 204a and 204b, first and second local oscillators (LO1 and LO2) 205a and 205b, first and second analog-to-digital converters (ADC) 206a and 206b, and a cross-correlation circuit (xcorr) 208. The first amplifier 202a, the first mixer 204a, and the ADC 206a may be considered a first measurement channel of the receiver 200. The second amplifier 202b, the second mixer 204b and the second ADC 206b may be considered a second measurement channel of the receiver 200.

In operation, an output of the DUT 20 is coupled to the input port 201 of the measurement receiver 30. Input port 101 may, for example, be configured for coaxial cable connection to the output of the DUT 20.

The splitter 207 is coupled to the input port 201 and is configured to supply the output signal of the DUT 20 to the receiver channels of the receiver 200. Here, one receiver channel includes the first amplifier 202a, the first mixer 204a driven by the first local oscillator 205a, and the first ADC 206a. The other receiver channel includes the second amplifier 202b, the second mixer 204b driven by the second local oscillator 205b, and the second ADC 206b.

In the first measurement channel, the first amplifier 202a amplifies the DUT output signal, and the resultant amplified signal is frequency down-converted by the first mixer 204a. The first mixer 204a is driven by the first local oscillator 205a which outputs a local oscillation signal of a first frequency LO1. The frequency down-conversion is to a target frequency within the capture range of the first ADC 206a. The first ADC 206a outputs a corresponding first total noise digital signal. The first total noise digital signal constitutes total noise samples (total noise power samples) which includes noise contributed by the DUT 20 and noise contributed by the first measurement channel of the noise receiver 200.

Likewise, in the second measurement channel, the second amplifier 202b amplifies the DUT output signal, and the resultant amplified signal is frequency down-converted by the second mixer 204b. The second mixer 204b is driven by the second local oscillator 205b which outputs a local oscillation signal of a second frequency LO2. The frequency down-conversion is to a target frequency within the capture range of the second ADC 206b. The second ADC 206b outputs a corresponding second total noise digital signal. The second total noise digital signal constitutes total noise samples (total noise power samples) which includes noise contributed by the DUT 20 and noise contributed by the second measurement channel of the noise receiver 200.

In the example of the present embodiment, the first measurement channel does not include a pre-selector between the input port 201 and the input of the first mixer 204a, and the second measurement channel is devoid of a pre-selector between the input port 201 and the input to the second mixer 204b.

Figure 3:
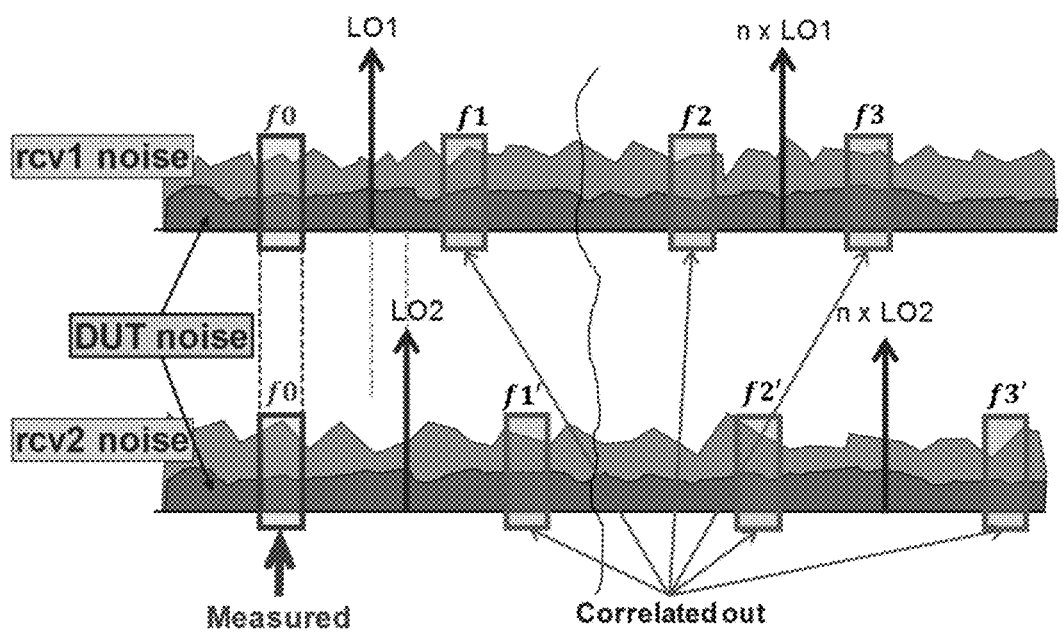
FIG. 3 is a noise signal diagram for reference in describing noise measurement channels of the noise receiver of FIG. 2.

Reference is now made to the signal diagram of FIG. 3 for reference in describing an operation of the noise receiver 200 of FIG. 2.

The top portion of FIG. 3 is representative of the total noise output in the frequency domain by the first measurement channel of the noise receiver 200. As mentioned previously, the total noise output includes noise contributed by the DUT 20 ("DUT noise" in FIG. 3) and noise contributed by the first measurement channel of the noise receiver 200 ("rcv1 noise" in FIG. 3). Likewise, the bottom portion of FIG. 3 is representative of the total noise output by the second measurement channel of the noise receiver 200. Again, the total noise output by the second measurement channel includes noise contributed by the DUT 20 ("DUT noise in FIG. 3) and noise contributed by the second measurement channel of the noise receiver 200 ("rcv2 noise" in FIG. 3).

The local oscillators LO1 and LO2 are set as different frequencies so that unwanted responses will be originated from different RF frequencies between the two measurement channels. This is shown in FIG. 3 where f0 denotes a measured frequency, and f1 and f1' denoted images in the first and second measurement channels, respectively. As is well understood, an image (or response) frequency is one which lies opposite and equidistant from the LO frequency. FIG. 3 additionally illustrates images f2 and f3 for the first measurement channel, and f2' and f3' for the second measurement channel, which are present at opposite sides of multiples "n" of the local oscillator frequencies LO1 and LO2. As described below, the cross-correlation circuit (xcorr) 208 of FIG. 2 is configured to correlate out or eliminate the images f1~f3 and f1'~f3'.

The total noise measured by each measurement channel may be characterized by Equation 2 as follows:

$$Y1 = \qquad \text{Equation 2}$$
$$(X(f_0) + N1(f_0)) + (X(f_1) + N1(f_1)) + (X(f_2) + N1(f_2)) + \ldots ,$$
$$Y2 = (X(f_0) + N2(f_0)) + (X(f_1') + N2(f_1')) + (X(f_2') + N2(f_2')) + \ldots$$

where,
- Y1 is a total measured output noise of the first measurement channel,
- Y2 is a total measure output noise of the second measurement channel,
- X is the noise contributed by the DUT 20,
- N1 is the noise contributed by the first measurement channel,
- N2 is the noise contributed by the second measurement channel,
- f0 is the frequency target to be measured for the DUT 20,
- f1, f2, . . . are unwanted images (or responses) of the first measurement channel, and
- f1', f2', . . . are unwanted images (or responses) of the second measurement channel.

Given the total output noise Y1 and Y2 of each measurement channel as above, a cross-spectrum average operation can be performed as characterized by Equation 3 determine the noise X at the target frequency f0:

$$\langle Y1(f_0)Y2^*(f_0)\rangle_m = \langle X(f_0)X^*(f_0)\rangle_m + \qquad \text{Equation 3}$$
$$(\text{decrease propotionally to } 1/\sqrt{m}) \rightarrow \langle |X(f_0)|^2\rangle_m$$

where,
- m is a number of sample values obtained for each of the first and second channels,
- * indicates a complex conjugate, and
- < >$_m$ denotes an average of m sample values.

Since the unwanted frequency images are different between two measurement channels, the cross-terms decrease by increasing average (m) and converge to 0, so the cross-spectrum average converges to $|X(f_0)|^2$ which may be characterized by Equation 4 below:

$$\langle Y1Y2^*\rangle_m = \langle |X|^2\rangle_m \qquad \text{Equation 4}$$

With the output noise X of the DUT 20 being measured as above, the DUT noise figure and/or noise factor can be determined as discussed previously in connection with Equation 1.

The number of samples m is at least 1 according to embodiments of the inventive concepts. However, since the cross-terms converge to 0 with an increase in m, the sensitivity of the measurement of the output noise X increases as m increases. Separately, as will be appreciated by those skilled in the art, the equations presented above are simplified in the sense that there may be many more cross terms between multiple frequencies.

Figure 4A:
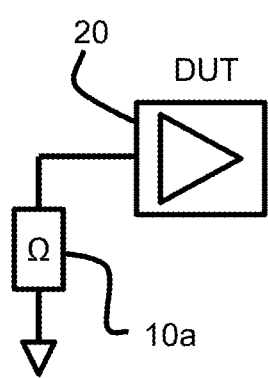
FIGS. 4A and 4B are circuit diagrams of device-under-test (DUT) terminations according to embodiments of the inventive concepts.
Figure 4B:
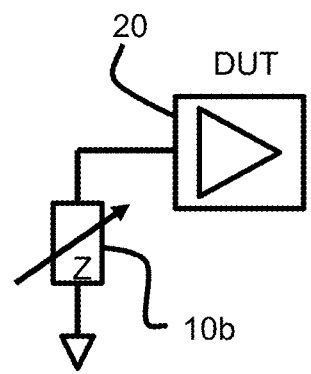

Referring to FIG. 4A, in some embodiments of the inventive concepts, the termination 10 may be a resistive termination. As one specific but non-limiting example, the termination 10 may be a 50Ω termination resistance. In alternative embodiments, the termination 10 may be a tunable impedance source 10b as represented in FIG. 4B In some embodiments of the inventive concept, the noise receiver 200 includes the computational circuits necessary to derive the noise figure and/or noise factor from the output noise X determined by the cross-correlation circuit (xcorr) 208. In this case, the noise receiver 200 itself outputs and/or displays the noise figure and/or noise factor of the DUT. The noise receiver may be operatively used in conjunction with separate circuitry (not shown) that measures a gain of the DUT 20. The gain measuring circuitry may be separately equipped or integrated with the noise receiver 200 in a single instrument.

Figure 5:
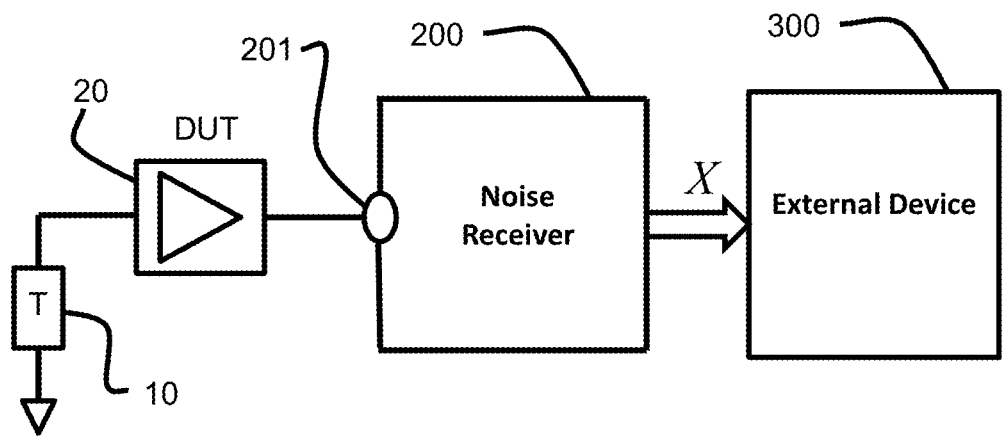
FIG. 5 is a circuit diagram of a test set-up for measuring noise of a DUT according to embodiments of the inventive concepts.
Figure 6:
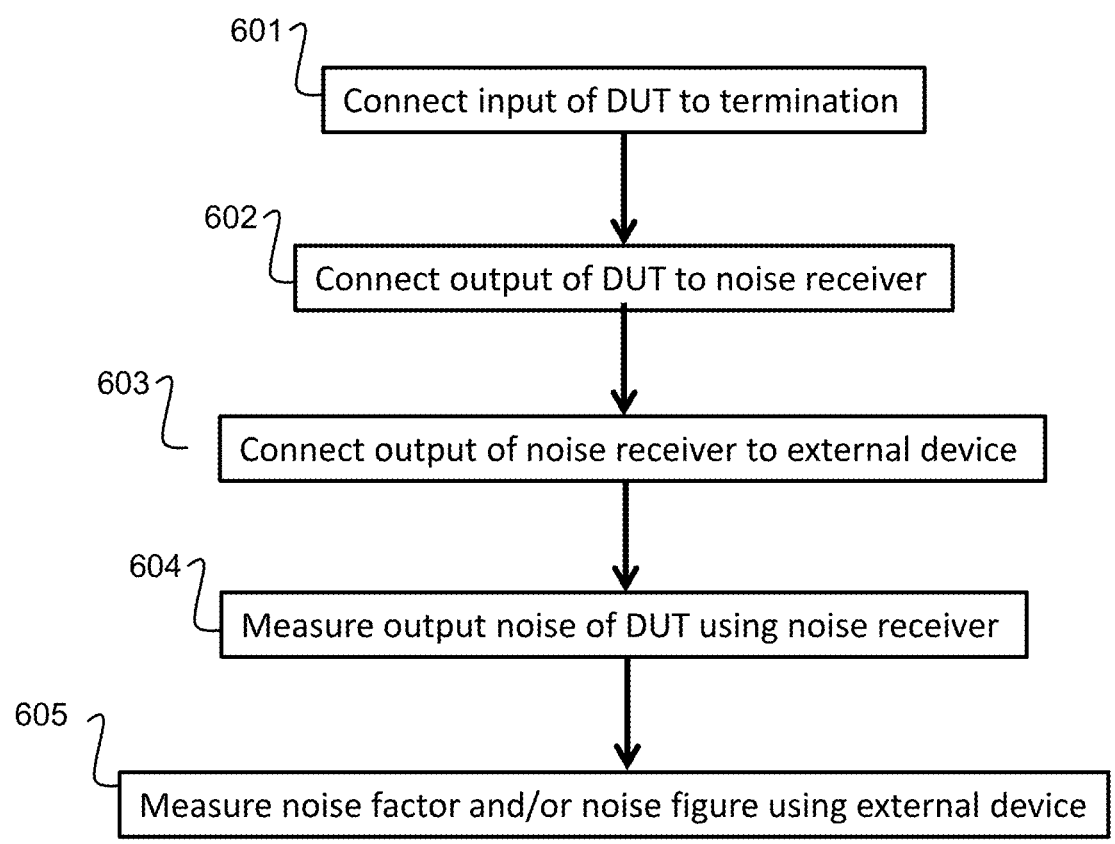
FIG. 6 is a flowchart for reference in describing a method of measuring a noise parameter according to embodiments of the inventive concepts.

In other embodiments of the inventive concept, the noise receiver 200 outputs the output noise X to an external device (e.g., an analyzer, oscilloscope, personal computer (PC) and the like) for computation of the noise figure and/or noise factor. An example of this is illustrated in FIG. 5 showing a test set-up including the noise-measurement receiver 200 of the previous embodiments connected to an external device 300. FIG. 6 is a flowchart for reference in describing a method of measuring a noise figure using the test set-up of FIG. 5.

Referring to FIGS. 5 and 6, the input of the DUT 20 is connected to a reference circuit such as the termination 10a or 10b shown in FIG. 4A or 4B (Step 601). The output of the DUT 20 is connected to a noise-measurement receiver 200 (Step 602), and the output of the noise-measurement receiver 200 is connected to an external device 300 (Step 603). In a measurement operation, the noise-measurement receiver 200 is used to measure an output noise X of the DUT 20 as described above (Step 604), and the external device 300 determines the noise figure of the DUT in accordance with Equation 1 describe previously from the output noise X measured by the noise-measurement receiver 200. Again, the noise receiver 200 may be operatively used in conjunction with separate circuitry (not shown) that measures a gain of the DUT 20 and supplies the gain to the external device 300.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

What is claimed is:

1. A receiver for measuring the output noise of a device-under-test (DUT), comprising:
   an input port configured to connect to an output of the DUT;
   a first measurement channel including a first amplifier having an input connected to the input port, a first mixer having an input connected to an output of the first amplifier, a first local oscillator (LO) for driving the first mixer at a first LO frequency, and a first analog-to-digital converter (ADC) for converting an output of the first mixer to a first total noise digital signal, wherein the first mixer down-converts a first output signal to a first target frequency within a capture range of the first ADC;
   a second measurement channel including a second amplifier having an input connected to the input port, a second mixer having an input connected to an output of the second amplifier, a second local oscillator (LO) for driving the second mixer at a second LO frequency which is different than the first LO frequency, and a second analog-to-digital converter (ADC) for converting an output of the second mixer to a second total noise digital signal, wherein the second mixer down-converts a second output signal to a second target frequency within a capture range of the first ADC; and
   a cross-correlation circuit configured to cross-correlate sample values obtained from the first and second total noise digital signals of the respective first and second measurement channels to obtain the output noise of the DUT.

2. The receiver of claim 1, wherein the first measurement channel is devoid of a pre-selector between the input port and the input of the first mixer, and the second measurement channel is devoid of a pre-selector between the input port and the input of the second mixer.

3. The receiver of claim 1, wherein the cross-correlation circuit is configured to cross-correlate the sample values according to the following equation:

$$<Y1 Y2^*>_m = |<X|^2>_m$$

where: X is the output noise of the DUT,
Y1 is a total output noise of the first channel,
Y2 is a total output noise of the second channel,
m is a number of sample values obtained for each of the first and second channels,
* indicates a complex conjugate, and
$<>_m$ denotes an average of m sample values.

4. The receiver of claim 1, wherein m is an integer of at least 1.

5. The receiver of claim 4, wherein m is set in advance by a user, and cross-correlation of the sample values is complete to obtain a final value of X when the number of samples reaches m.

6. The receiver of claim 4, wherein cross-correlation of the sample values terminates to obtain a final value of X when the when increased resolution in X from one sample value to a next sample value reaches a preset value.

7. The receiver of claim 1, wherein a frequency of the output noise is in the RF spectrum.

8. A measurement system for measuring a noise parameter of a device-under-test (DUT), the noise parameter being at least one of a noise factor and a noise figure of the DUT, comprising:
   a reference circuit configured for connection to an input of the DUT; and
   a noise-measurement receiver configured to measure an output noise of the DUT while the reference circuit is connected to the input of the DUT,
   wherein the noise-measurement receiver comprises:
      an input port configured to connect to an output of the DUT;
      a first measurement channel including a first amplifier having an input connected to the input port, a first mixer having an input connected to an output of the first amplifier, a first local oscillator (LO) for driving the first mixer at a first LO frequency, and a first analog-to-digital converter (ADC) for converting an output of the first mixer to a first total noise digital signal, wherein the first mixer down-converts a first output signal to a first target frequency within a capture range of the first ADC;

a second measurement channel including a second amplifier having an input connected to the input port, a second mixer having an input connected to an output of the first amplifier, a second local oscillator (LO) for driving the second mixer at a second LO frequency which is different than the first LO frequency, and a second analog-to-digital converter (ADC) for converting an output of the second mixer to a second total noise digital signal, wherein the second mixer down-converts a second output signal to a second target frequency within a capture range of the second ADC; and a cross-correlation circuit configured to cross-correlate sample values obtained from the first and second total noise digital signals of the respective first and second measurement channels to obtain the output noise of the DUT.

9. The measurement system of claim 8, wherein the reference circuit is one of a resistive termination or a tunable impedance source.

10. The measurement system of claim 8, wherein noise-measurement receiver is further configured to compute the noise parameter of the DUT for the obtained output noise of the DUT.

11. The measurement system of claim 8, further comprising an external device configured to compute the noise parameter of the DUT for the obtained output noise of the DUT.

12. The measurement system of claim 8, wherein the first measurement channel is devoid of a pre-selector between the input port and the input of the first mixer, and the second measurement channel is devoid of a pre-selector between the input port and the input of the second mixer.

13. The receiver of claim 8, wherein the cross-correlation circuit is configured to cross-correlate the sample values according to the following equation:

$$<Y1\,Y2^*>_m = <|X|^2>_m$$

where: X is the output noise of the DUT,
Y1 is a total output noise of the first channel,
Y2 is a total output noise of the second channel,
m is a number of sample values obtained for each of the first and second channels,
* indicates a complex conjugate, and
$<>_m$ denotes an average of m sample values.

14. The receiver of claim 13, wherein m is an integer of at least 1.

15. The receiver of claim 14, wherein m is set in advance by a user, and cross-correlation of the sample values is complete to obtain a final value of X when the number of samples reaches m.

16. The receiver of claim 14, wherein cross-correlation of the sample values terminates to obtain a final value of X when the when an increased resolution in X from one sample value to a next sample value reaches a preset value.

17. A method for measuring a noise parameter of a device-under-test (DUT), the noise parameter being at least one of a noise factor and a noise figure of the DUT, comprising:

connecting an input of the DUT to a reference circuit, and connecting an output of the DUT to a noise-measurement receiver;

using the noise-measurement receiver to measure an output noise of the DUT; and determining the noise parameter of the DUT from the output noise measured by the noise-measurement receiver, wherein the noise-measurement receiver comprises:
an input port connected to the output of the DUT;
a first measurement channel including a first amplifier having an input connected to the input port, a first mixer having an input connected to an output of the first amplifier, a first local oscillator (LO) driving the first mixer at a first LO frequency, and a first analog-to-digital converter (ADC) converting an output of the first mixer to a first total noise digital signal, wherein the first mixer down-converts a first output signal to a first target frequency within a capture range of the first ADC;
a second measurement channel including a second amplifier having an input connected to the input port, a second mixer having an input connected to an output of the second amplifier, a second local oscillator (LO) driving the second mixer at a second LO frequency which is different than the first LO frequency, and a second analog-to-digital converter (ADC) converting an output of the second mixer to a second total noise digital signal, wherein the mixer down-converts a second output signal to a second target frequency within a capture range of the first ADC; and
a cross-correlation circuit cross-correlating sample values obtained from the first and second total noise digital signals of the respective first and second measurement channels to obtain the output noise of the DUT.

18. The method of claim 17, wherein the noise parameter is determined by the noise-measurement receiver.

19. The method of claim 17, wherein noise parameter is determined by an external device which receives the measured output noise of the DUT from the noise-measurement receiver.

20. The method of claim 17, wherein the first measurement channel is devoid of a pre-selector between the input port and the input of the first mixer, and the second measurement channel is devoid of a pre-selector between the input port and the input of the second mixer.

* * * * *